July 31, 1956 A. HAR'EL ET AL 2,757,289
TRANSISTOR OSCILLATOR CIRCUIT
Filed June 30, 1954

INVENTORS
CHUNG C. CHENG
& ABRAHAM HAR'EL
BY H. L. Newton
ATTORNEY

United States Patent Office 2,757,289

Patented July 31, 1956

2,757,289

TRANSISTOR OSCILLATOR CIRCUIT

Abraham Har'el, Camden, N. J., and Chung C. Cheng, Forest Hills, N. Y., assignors to Radio Corporation of America, a corporation of Delaware Application June 30, 1954, Serial No. 440,458

11 Claims. (Cl. 250—36)

This invention relates in general to electrical signal generators or oscillator circuits and in particular to such circuits which utilize semi-conductor devices of the junction type as active signal amplifying elements.

Transistors, as is well known, are of two general classes which are known as the point-contact transistor and the junction transistor. Each of these classes is known to exhibit different characteristics which are useful and desirable for certain circuit applications.

The current gain of junction transistors, as defined by the ratio of collector electrode current increments to emitter electrode current increments may be less than unity. It has, moreover, been generally necessary to provide an external feedback path to sustain oscillations in circuits utilizing junction transistors. Point-contact transistors, as is well known, may be current multiplication devices and may, under certain operating conditions, exhibit a negative resistance. Thus oscillators have been constructed using point-contact transistors which do not require an external feedback path.

Both point-contact and junction transistor oscillator circuits have been characterized to some extent by frequency instability. It has been found, for example, that the fundamental operating frequency of transistor oscillators may vary with time for a single setting of the circuit components. These variations in the fundamental frequency may be the result of variations in the effective input and output impedance of the transistor. These impedance variations may be due, for example to variations in operating bias potential. They can also be due to ambient temperature variations, since as is well known and understood, semi-conductor devices are temperature sensitive. Finally, these impedance variations may be due to the replacement of one transistor with another transistor, for as is well known individual transistors although intended to have identical characteristics when manufactured, may differ from each other.

It is, accordingly, an object of the present invention to provide an improved semi-conductor oscillator circuit capable of generating an oscillatory wave of substantially constant frequency.

It is another object of the present invention to provide an improved oscillation generator which effectively may utilize a junction transistor as the active signal amplifying element.

It is still another object of the present invention to provide a semi-conductor oscillator circuit which effectively may utilize a transistor of the junction type and which is characterized by stable and highly efficient circuit operation.

It is yet another object of the present invention to provide a transistor oscillator circuit of the common emitter type which provides substantially constant frequency output energy despite changes in the input and output impedance of the transistor.

These as well as further objects and advantages of the present invention are achieved in general by utilizing a frequency determining network having a plurality of reactive arms as the feedback network in an oscillator circuit utilizing a transistor of the common emitter configuration. Energy is fed back from the output to the input of the device through this network of proper phase and magnitude to overcome circuit losses and sustain oscillation. Moreover, by proper choice of the reactive elements comprising the feedback network highly stable and efficient operation is realized and a substantially constant frequency output signal is provided despite changes in the input and output impedance of the transistor due to any cause.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
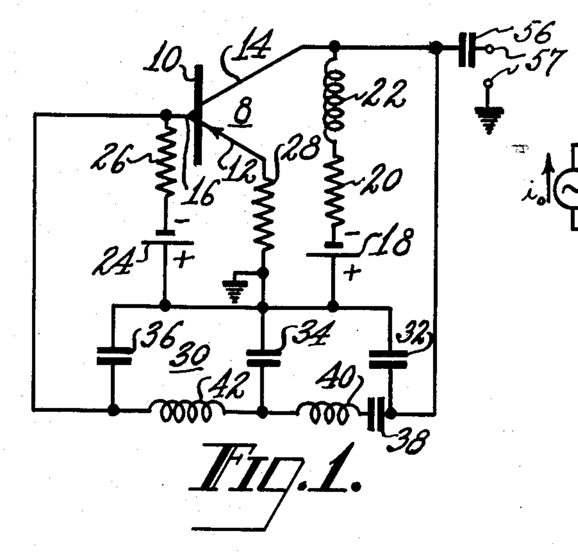
Figure 1 is a schematic circuit diagram of a transistor oscillator circuit embodying the present invention.

Referring now to the drawing wherein like elements are designated by like reference numerals throughout the figures, and referring particularly to Figure 1, a transistor 8 which is preferably of the junction variety includes a semi-conductive body 10 and three contacting electrodes which have been designated as an emitter 12, a collector 14 and a base 16. To provide proper biasing potentials for oscillator operation, the negative terminal of a battery 18 is connected through a resistor 20 and a radio frequency choke coil 22 to the collector 14 of the transistor 8. The positive terminal of the battery 18 is returned to a source of fixed reference potential or ground for the system as shown. While a P–N–P transistor has been used to illustrate the invention, N–P–N junction transistors may be used by reversing the polarity of the biasing source, or in the alternative, transistors of either conductivity type having characteristics similar to junction transistors could be used. In the preferred embodiment, and for most efficient frequency stabilization, however, junction transistors of either conductivity type are to be preferred.

To provide a biasing voltage source for the base 16, a battery 24 has its negative terminal connected through a resistor 26 to the base 16 of the transistor 8 and its positive terminal is grounded. The emitter 12 of the transistor is connected through a resistor 28 to the system ground as shown. A transistor connected in this manner is often referred to as a common-emitter configuration.

As shown, the transistor is biased for normal amplifier action, i. e., the emitter 12 is positive with respect to the base 16 while the collector 14 is negative with respect to the base 16. Thus the collector 14 is referred to as being biased in the relatively non-conducting or reverse direction with respect to the base. The emitter 12, on the other hand, is referred to as being biased in the relatively conducting or forward direction with respect to the base.

Proper feedback for sustained oscillation of the circuit is provided, in accordance with the teachings of the present invention, by connecting a five arm frequency determining reactive network 30 effectively between the output or collector 14 and the input or base 16 of the transistor 8. By such an expedient frequency stability despite variations in the input and output impedances of the transistor 8 is achieved. The feedback network 30 comprising the invention includes three shunt capacitors 32, 34 and 36, respectively, for three arms or branches and in addition has two series arms or branches. One of the series arms comprises an inductor 40 and a direct current blocking capacitor 38. It should be understood, however, that the blocking capacitor 38 could be connected between the collector 14 and the junction of capacitor 32 and the inductor 40 (as in Figure 4) or alternatively between the base and the junction of the capacitor 36 and the inductor 42. The other series arms comprise an inductor 42. In operation, signal energy is fed back from the output or collector 14 to the input or base 16 of the transistor of proper phase and magnitude to overcome normal circuit losses and sustain oscillation. The output oscillatory wave may be taken from the collector circuit. To this end, a pair of output terminals 57 are provided, one of which is grounded as shown and the other of which is connected through a coupling capacitor 56 to the collector 14 of the transistor 8.

The oscillator circuit as described is seen to be relatively simple. In addition, circuit operation has been found to be stable, efficient and reliable. Moreover, by providing a feedback network connected in accordance with the teachings of the present invention and properly choosing the circuit parameters of that network, frequency variations despite wide variations in the output and input impedance of the transistor are minimized and for practical purposes are eliminated. This can be shown from a consideration of Figures 2 and 3 wherein the circuit parameters for optimum operating conditions have also been derived.

Figure 2:
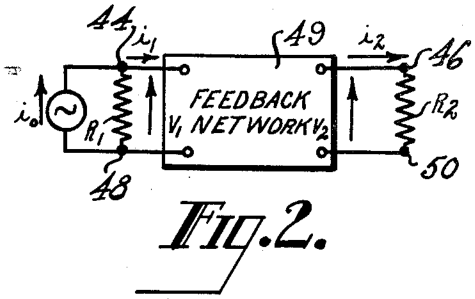
Figure 2 is a simplified equivalent circuit diagram of a feedback oscillator circuit.

Referring now to the simplified equivalent circuit diagram of Figure 2, a feedback oscillator circuit which includes a junction transistor of the common emitter circuit configuration is represented by a four terminal network. Thus the equivalent circuit includes an output or collector terminal 44, an input or base terminal 46 and a pair of common or emitter terminals 48 and 50 respectively. The input resistance for the transistor is represented by a resistor $R_2$ which is connected between the terminals 46 and 50. The output resistance for the transistor is represented by the resistor $R_1$ which is connected between the terminals 44 and 48. A source of signal current $i_0$ may also be provided and is represented as also being connected between the terminals 44 and 48.

The output or collector terminal 44 and one of the common terminals 48 are connected with the input terminals of a frequency determining feedback network 49. Similarly, the input or base terminal 46 of the transistor and the other emitter or common terminal 50 are connected with the output terminals of the feedback network 49. For the purpose of simplifying the circuit analysis it is assumed that the feedback network contains only reactive elements.

As is well known and understood the four terminal feedback network can be represented by the following equations:

$$v_1 = a_{11}v_2 + a_{12}i_2$$

$$i_1 = a_{21}v_2 + a_{22}i_2$$

where $v_1$ and $v_2$=input and output signal-voltages respectively of feedback network 49;

$i_1$ and $i_2$=input and output signal-currents respectively of feedback network 49; and $a_{11}$, $a_{12}$, $a_{21}$ and $a_{22}$=constants.

Similarly, the transistor active network can be represented by the following equations:

$$i_0 = i_1 + \frac{v_1}{R_1}$$

$$v_2 = i_2R_2$$

$$i_0 = \alpha_{cb}i_2$$

where $\alpha_{cb}$=current amplification factor between collector and base.

Solving the foregoing equations it is seen that:

$$-\alpha_{cb} = a_{11}\frac{R_2}{R_1} + a_{12}\frac{1}{R_1} + a_{21}R_2 + a_{22}$$

It can also be shown that if the feedback network contains only reactive components, the constants $a_{11}$ and $a_{22}$ will be real, while the constants $a_{12}$ and $a_{21}$ will be imaginary. Moreover, if it is assumed that the frequency of oscillation is lower than the cutoff frequency, thus making the imaginary part of $\alpha_{cb}$ negligible, the following criteria can be obtained by separation of real and imaginary values:

$$a_{11}\frac{R_2}{R_1} + a_{22} = -\alpha_{cb} \qquad (1)$$

$$a_{12}\frac{1}{R_1} + a_{21}R_2 = 0 \qquad (2)$$

Since the constants $a_{12}$ and $a_{21}$ are imaginary, Equation 2 is a frequency-determining equation. The frequency must be independent of the output and input resistances ($R_1$ and $R_2$) of the transistor in order to obtain frequency stabilization. In order to obtain this condition it is required that:

$$a_{12} = 0 \qquad (3)$$

$$a_{21} = 0 \qquad (4)$$

Equations 3 and 4 are, therefore, the frequency and frequency stability equations. Equation 1, on the other hand, is the criterion for the amplitude of oscillations, and determines the minimum value of $\alpha_{cb}$ needed to maintain oscillations.

Figure 3:
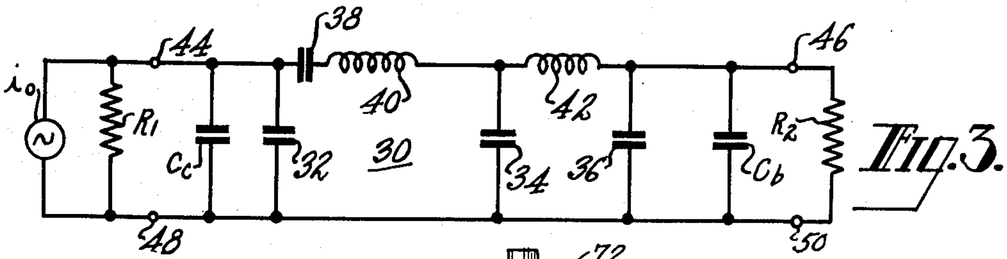
Figure 3 is an equivalent circuit diagram of the oscillator circuit of Figure 1.

Referring now to Figure 3, the equivalent circuit diagram of a transistor oscillator circuit of the type illustrated in Figure 1 includes the output or collector terminal 44, the input or base terminal 46 and the pair of common or emitter terminals 48 and 50 respectively. The input or base capacity for the transistor is represented by a capacitor $C_b$ which is connected between the base terminal 46 and the common or emitter terminal 50. The input resistance for the transistor is represented as in Figure 2 by the resistor $R_2$ which is also connected between the terminals 46 and 50 and in parallel with the capacitor $C_b$. The source of signal current $i_0$ is also provided and is indicated connected between the collector terminal 44 and the other common or emitter terminal 48. The output or collector capacity for the transistor is represented by a capacitor $C_c$ which is connected between the collector and emitter terminals 44 and 48 respectively. Similarly, the output resistance for the transistor is represented by the resistor $R_1$ which is also connected between the collector and emitter terminals 44 and 48. The equivalent circuit diagram also includes the five arm reactive frequency-determining feedback network comprising the capacitors 32, 34 and 36, the inductors 40 and 42, and the blocking capacitor 38 connected in the same manner as in Figure 1.

The parameters $a_{11}$, $a_{12}$, $a_{21}$, $a_{22}$ may be evaluated for the feedback network 30. The Equations 1, 3, 4 may then be solved yielding solutions which are given hereinafter.

It may be determined from Equation 3 that:

$$\omega^2 = \frac{1}{2}\left[\frac{1}{C_{34}L_{42}} + \frac{1}{C_{38}L_{40}} + \frac{1}{C_{34}L_{40}} \pm \sqrt{\left(\frac{1}{C_{34}L_{42}} + \frac{1}{C_{38}L_{40}} + \frac{1}{C_{34}L_{40}}\right)^2 - \frac{4}{C_{34}C_{38}L_{40}L_{42}}}\right]$$

where $\omega$=angular frequency of oscillatory energy;

$C_{34}$ and $C_{38}$=capacity of capacitors 34 and 38 respectively;

$L_{40}$ and $L_{42}$=inductance of inductors 40 and 42 respectively.

The following ratios can then be introduced:

$$\frac{L_{42}}{L_{40}}=m$$

$$\frac{C_{bt}}{C_{34}}=p$$

$$\frac{C_{ct}}{C_{34}}=q$$

where:

$C_{bt}=C_{26}+C_b$, and $C_{36}$ and $C_b$=capacity of capacitors 36 and $C_b$ respectively;

$C_{ct}=C_{32}+C_c$, and $C_{32}$ and $C_c$=capacity of capacitors 32 and $C_c$ respectively.

The capacity of the capacitor 38 approaches infinity or mathematically $C_{38}\rightarrow\infty$ since it is a blocking capacitor. Therefore:

$$\omega^2=\frac{1}{C_{34}}\left(\frac{1}{L_{42}}+\frac{1}{L_{40}}\right)$$

or:

$$\omega^2=\frac{1}{C_{34}L_{42}}(1+m)$$

and the frequency of oscillation ($f$) is given by:

$$f=\frac{1}{2\pi}\sqrt{\frac{1+m}{C_{34}L_{43}}}$$

By substitution in Equation 4 it can also be shown that the criteria for frequency stability are:

$$m=\frac{1\pm\sqrt{1-4pq}}{2p}$$

If, however, $1-4_{pq}=0$, then:

$$m=\frac{1}{2p};\ q=\frac{1}{4p};$$

and $$q=\frac{m}{2};\ p=\frac{1}{2m}$$

Thus it is apparent that:

$$\frac{L_{42}}{L_{40}}=m;\ \frac{C_{bt}}{C_{34}}=\frac{1}{2m}$$

and $$\frac{C_{ct}}{C_{34}}=\frac{m}{2}$$

Thus in order to achieve frequency stability the circuit parameters of the feedback network should be proportioned approximately in accordance with the foregoing ratios. For optimum frequency stability the parameters will be proportioned to satisfy these equations exactly. It is obvious from the foregoing equations that in order to satisfy the condition of best frequency stability, the variation of $C_{bt}$ and $C_{ct}$, which is caused by the variation of the input capacity ($C_b$) and output capacity ($C_c$) respectively, should be small. It, therefore follows that for best frequency stability the ratio of $C_{32}$ to $C_c$ and the ratio of $C_{36}$ to $C_b$ respectively will be very much larger than unity, or expressed mathematically:

$$\frac{C_{32}}{C_c}\gg 1$$

$$\frac{C_{36}}{C_b}\gg 1$$

It can also be shown that for the conditions mentioned above:

$$a_{11}=\frac{-1}{m^2}$$

$$a_{22}=-m$$

Then:

$$v_1=\frac{-1}{m^2}v_2$$

$$i_1=-mi_2$$

$$\frac{v_2/i_2}{v_1/i_1}=m^3$$

The last equation shows that, for optimum operation, $m$ should preferably be the cube root of the ratio of input to output impedances of the transistor, thus assuring proper impedance matching through the feedback network.

By substituting the preceding values in Equation 1, it becomes:

$$\frac{1}{m^2}\frac{R_2}{R_1}+m=\alpha_{cb}$$

This final equation will thus determine whether the current amplification factor ($\alpha_{cb}$) of the transistor is sufficient to maintain the amplitude of oscillation. In actual practice if the $\alpha_{cb}$ is larger than this quantity, the circuit will oscillate more strongly until the amplitude of oscillation is limited by resistor 28 which serves as a negative current feedback element. One of the advantages of the circuit from the foregoing analysis is thus seen to be that only the amplitude and not the frequency of oscillation depends on the circuit amplification factor ($\alpha_{cb}$) of the transistor. Accordingly, variations in temperature and biasing potentials, or aging and interchanging of the transistor, which will in turn tend to vary the $\alpha_{cb}$ and the input and output impedances of the transistor, will not affect the operating frequency of the oscillator.

By utilizing the foregoing circuit analysis, a frequency stable oscillator circuit has been constructed to operate at a frequency of 41 kilocycles per second. While it will be understood that the circuit specifications may vary according to the design for any particular application, and should be recalculated for a different operating frequency, the following circuit specifications are included for the circuit of Figure 1 by way of example only.

Transistor 8—P–N–P junction having:

$R_1$=6000 ohms
$R_2$=200 ohms
$C_c$=10 to 100 micromicrofarads
$C_b$=.001 to .01 microfarad
$C_{32}$, $C_{34}$ and $C_{36}$=.011; .066; and .1 microfarad respectively
$L_{40}$ and $L_{42}$=1.0 and .33 millihenry respectively
$R_{20}$ and $R_{28}$=50,000 and 220 ohms respectively
Battery 18 and 24=13.5 volts each
Resistor 26=greater than 2 megohms A circuit having the foregoing specifications has been tested. A frequency drift of 0.5 cycle per second was observed for a reduction of the collector voltage biasing supply of twenty per cent. A drift of 30 cycles per second was observed as the ambient temperature was varied from 27° to 57° centigrade. Moreover, when five arbitrarily chosen P–N–P junction transistors of the same type were interchanged in the circuit, a frequency drift of less than ±26 cycles per second was observed. Thus it is seen that a circuit constructed in accordance with the teachings of the present invention is characterized by constant frequency oscillator output energy despite changes in temperature, operating bias supply or the interchanging of transistors.

The oscillator circuit which comprises the present invention may find wide application in electronic communication circuits of all types. Thus it may find application as a source of fixed frequency oscillations. It is also apparent that this type of oscillator circuit may be used as the local oscillator in a superheterodyne receiver.

Figure 4:
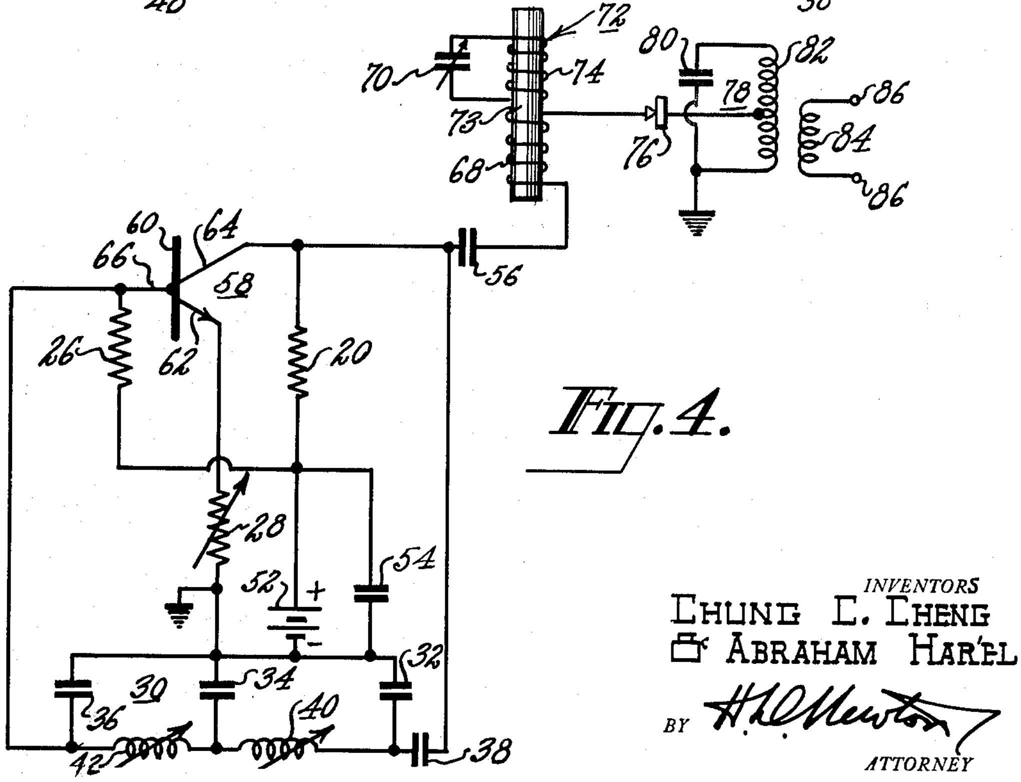
Figure 4 is a schematic circuit diagram of a portion of a superheterodyne signal receiving system which includes an oscillator circuit of the type embodying the present invention.

Thus, for example, in Figure 4 the oscillator signals appearing in the collector of the transistor may be coupled through a decoupling capacitor 56 and through a coupling winding 68 of a loop antenna 72 to the anode of a crystal diode 76 acting as the mixer or first detector of the receiver.

The oscillator circuit which is illustrated in Figure 4 includes a junction transistor 58, which is illustrated as being of the N–P–N conductivity type in this figure. The transistor 58 includes a semi-conductive body 60 and three contacting electrodes which have been designated as an emitter 62, a collector 64 and a base 66. A single biasing source is used to provide the proper direct current operating conditions in the circuit configuration illustrated in Figure 4 of the drawing. To this end, a battery 52 has its negative terminal grounded and its positive terminal connected through the resistor 20 to the collector 64 of the transistor 58. The positive terminal of the battery 52 is also connected through a resistor 26 to the base 66 of the transistor 58. Rather than using the radio frequency choke coil as in Figure 1, the battery 52 may be by-passed for signal frequencies by a capacitor 54. The emitter 62 of the transistor 58 is connected through the resistor 28 which in this case is variable as shown to ground. By making the resistor 28 variable the amplitude of the available oscillator energy can be made variable.

As shown, the transistor 58 is seen to be biased for normal amplifier action of an N–P–N junction transistor. That is, the collector 64 is referred to as being biased in the relatively non-conducting or reverse direction with respect to the base 26. The emitter 62, on the other hand, is referred to as being biased in the relatively conducting or forward direction with respect to the base 66.

In other respects the circuit illustrated in Figure 4 is seen to be identical with the one illustrated in Figure 1 of the drawing. Thus the frequency determining feedback network 30 comprises a five arm reactive network which provides frequency stability in accordance with the present invention as described hereinbefore. For signal receiving applications, however, a variable frequency source of oscillator energy is generally necessary. To this end, the inductance of the series inductors of the reactive feedback network are made variable and ganged together as shown for simultaneous operation. Thus by varying the inductance of these inductors, the frequency of the available oscillator signal may also be varied. In order to maintain the proper proportioning of these inductances for optimum frequency stable operation, the inductance of both inductors should be varied so that their ratio is maintained at a substantially constant optimum figure.

The loop antenna 72 may comprise a ferromagnetic core or rod 73 which has a signal pick-up winding 74 mounted thereon in inductively coupled relation to the coupling winding 68. The antenna winding 74 is tuned for response to incoming signals by a variable capacitor 70 connected in shunt relation thereto as shown.

The cathode of the heterodyne crystal mixer 76 is connected to a low impedance matching tap on a tuned inductor 82 of a frequency selective or resonant intermediate frequency output circuit 78. To form a parallel resonant circuit which is resonant at the selected intermediate or beat frequency, the inductor 82 is shunted by a tuning capacitor 80. The output or intermediate signal may be obtained from suitable terminals 86 of an intermediate frequency output inductor 84 inductively coupled to the inductor 82 as shown.

Incoming signals induced in the loop antenna 72 are applied to the crystal mixer 76 through the winding 68, where they are heterodyned with the local oscillator signals, which are coupled through the coupling capacitor 56 and the coupling winding 68. Thus a beat or intermediate signal is produced, which may here be assumed to have a frequency corresponding to either the sum or difference of the signal frequency and the oscillator frequency. The resonant circuit 78 may, therefore, be tuned, for example, to the difference frequency and conveys the intermediate frequency resultant signal to the output terminals 86 for further amplification as is well known.

As described herein, an improved transistor oscillator circuit which utilizes a frequency determining feedback network in accordance with the invention is characterized by stable, efficient and reliable operation. While the circuit connections are relatively simple, substantially constant frequency oscillator output signals are provided despite changes in the input and output impedance of the transistor.

What is claimed is:

1. An oscillator comprising a semi-conductor device having a semi-conductive body and an input electrode, an output electrode and a common electrode cooperatively associated therewith, means for applying energizing potentials to said electrodes, and feedback means effectively coupled between said output and input electrodes including a first, a second and a third shunt capacitor and a first and a second series inductor, the parameters of said feedback means being proportioned substantially in accordance with the ratios:

$$\frac{L_2}{L_1}=m;\ \frac{C_2}{C_1}=\frac{1}{2m};\ \frac{C_3}{C_1}=\frac{m}{2}$$

where:

$L_1$=inductance of said first inductor
$L_2$=inductance of said second inductor
$C_1$=capacitance of said first capacitor
$C_2$=capacitance of said second capacitor
$C_3$=capacitance of said third capacitor
$m$=a constant whereby said network provides substantially constant frequency operation of said oscillator.

2. In a radio receiver, a tunable local oscillator comprising a semi-conductor device having a semi-conductive body, a base electrode, a collector electrode and an emitter electrode in contact therewith, means for applying biasing voltages to said electrodes, and a frequency determining means coupled between said collector and base electrodes including a first, a second and a third shunt capacitor and a first and a second series variable tuning inductor, the parameters of said frequency determining means being proportioned in the order of the ratios:

$$\frac{L_2}{L_1}=m;\ \frac{C_2}{C_1}=\frac{1}{2m};\ \frac{C_3}{C_1}=\frac{m}{2}$$

where:

$L_1$=inductance of said first inductor
$L_2$=inductance of said second inductor
$C_1$=capacitance of said first capacitor
$C_2$=capacitance of said second capacitor
$C_3$=capacitance of said third capacitor
$m$=a constant whereby said network provides substantially constant frequency operation of said oscillator.

3. An oscillator comprising a semi-conductor device having a semi-conductive body and a base electrode, a collector electrode and an emitter electrode cooperatively associated therewith, means for applying energizing potentials to said electrodes, and frequency determining feedback means effectively coupled between said collector and base electrodes including a first, a second and a third shunt capacitor and a first and a second series inductor, the parameters of said feedback means being proportioned substantially in accordance with the ratios:

$$\frac{L_2}{L_1}=m;\ \frac{C_2}{C_1}=\frac{1}{2m};\ \frac{C_3}{C_1}=\frac{m}{2}$$

where:

$L_1$=inductance of said first inductor
$L_2$=inductance of said second inductor
$C_1$=capacitance of said first capacitor
$C_2$=capacitance of said second capacitor
$C_3$=capacitance of said third capacitor
$m$=a constant whereby said network provides substantially contact frequency operation of said oscillator.

4. An oscillator comprising a semi-conductor device having a semi-conductive body and an input electrode, an output electrode and a common electrode in contact therewith, means for applying energizing potentials to said electrodes, and a feedback network effectively coupled between said output and input electrodes, said network comprising a first, a second and a third shunt capacitor and a first and a second series inductor, the parameters of said network being proportioned in the order of the ratios:

$$\frac{L_2}{L_1}=m;\ \frac{C_2}{C_1}=\frac{1}{2m};\ \frac{C_3}{C_1}=\frac{m}{2}$$

where:

$L_1$=inductance of said first inductor
$L_2$=inductance of said second inductor
$C_1$=capacitance of said first capacitor
$C_2$=capacitance of said second capacitor
$C_3$=capacitance of said third capacitor
$m$=a constant whereby said network provides substantially constant frequency operation of said oscillator.

5. In an oscillator circuit including a point of reference potential therein, the combination with a transistor of the junction type having a semi-conductive body, and a base electrode, a collector electrode and an emitter electrode cooperatively associated therewith, of means for applying an operating bias voltage between said emitter and base electrodes in a relatively conducting polarity and for applying an operating bias voltage between said collector and base electrodes in a relatively non-conducting polarity, resistive means connected between said emitter electrode and said point of reference potential, and a frequency determining reactive feedback network connected between said collector and base electrodes, said network comprising a first, a second and a third shunt capacitor and a first and a second series inductor, the parameters of said network being proportioned in the order of the ratios:

$$\frac{L_2}{L_1}=m;\ \frac{C_2}{C_1}=\frac{1}{2m};\ \frac{C_3}{C_1}=\frac{m}{2}$$

where:

$L_1$=inductance of said first inductor
$L_2$=inductance of said second inductor
$C_1$=capacitance of said first capacitor
$C_2$=capacitance of said second capacitor
$C_3$=capacitance of said third capacitor
$m$=a constant whereby said network provides substantially constant frequency operation of said oscillator circuit.

6. An oscillator circuit as defined in claim 5 wherein said transistor is of the P–N–P junction type.

7. An oscillator circuit as defined in claim 5 wherein said transistor is of the N–P–N junction type.

8. An oscillator circuit as defined in claim 5 wherein a blocking capacitor is serially connected with said first inductor.

9. An oscillator circuit as defined in claim 5 wherein a blocking capacitor is connected between the collector of the transistor and the junction point of said first inductor and said first capacitor.

10. An oscillator circuit as defined in claim 5 wherein a blocking capacitor is connected between the base of the transistor and the junction point of said second inductor and said third capacitor.

11. In an oscillator circuit including a point of fixed potential therein, the combination with a junction transistor including a base, an emitter and a collector electrode, and a frequency determining reactive feedback network connected between said collector and base electrodes, said network comprising a first and second inductor serially connected between said collector and base electrodes, a first shunt capacitor connected between one end of said first inductor and said point of fixed potential, a second shunt capacitor connected between one end of said second inductor and said point of fixed potential, and a third shunt capacitor connected between the junction of said first and second inductors and said point of fixed potential, the parameters of said network being proportioned in the order of the ratios:

$$\frac{L_2}{L_1}=m;\ \frac{C_2}{C_1}=\frac{1}{2m};\ \frac{C_3}{C_1}=\frac{m}{2}$$

where:

$L_1$=inductance of said first inductor
$L_2$=inductance of said second inductor
$C_1$=capacitance of said first capacitor
$C_2$=capacitance of said second capacitor
$C_3$=capacitance of said third capacitor
$m$=a constant whereby said network provides substantially constant frequency operation of said oscillator circuit.

References Cited in the file of this patent

UNITED STATES PATENTS

| | | |
|---|---|---|
| 1,896,781 | Llewellyn | Feb. 7, 1933 |
| 2,096,829 | Turner | Oct. 26, 1937 |

OTHER REFERENCES

Article: "Junction transistor equivalent circuits and vacuum tube analogy," by Giacoletto; pages 1490–1493, Proc. I. R. E., vol. 40 No. 11, dated November 1952.